(12) United States Patent
Tomita et al.

(10) Patent No.: US 11,489,656 B2
(45) Date of Patent: Nov. 1, 2022

(54) WIRELESS STATION AND METHOD OF CORRECTING FREQUENCY ERROR

(71) Applicant: ICOM INCORPORATED, Osaka (JP)

(72) Inventors: Takeo Tomita, Osaka (JP); Masaki Akasaka, Osaka (JP); Yasuo Ueno, Osaka (JP)

(73) Assignee: ICOM INCORPORATED, Osaka (JP)

( * ) Notice: Subject to any disclaimer, the term of this patent is extended or adjusted under 35 U.S.C. 154(b) by 0 days.

(21) Appl. No.: 17/191,879

(22) Filed: Mar. 4, 2021

(65) Prior Publication Data

US 2021/0306131 A1    Sep. 30, 2021

(30) Foreign Application Priority Data

Mar. 26, 2020    (JP) .............................. JP2020-056801

(51) Int. Cl.
| | | |
|---|---|---|
| *H03D 3/22* | (2006.01) | |
| *H04L 27/22* | (2006.01) | |
| *H04L 7/00* | (2006.01) | |

(52) U.S. Cl.
CPC .......... *H04L 7/0016* (2013.01); *H04L 7/0054* (2013.01)

(58) Field of Classification Search
CPC .... H04L 7/0016; H04L 7/0054; H03C 3/0925
USPC ................. 375/329, 302, 271, 373–376, 371
See application file for complete search history.

(56) References Cited

U.S. PATENT DOCUMENTS 9,935,640 B1 *   4/2018   Chan ................... H03C 3/0925

FOREIGN PATENT DOCUMENTS

JP              5783017           9/2015

* cited by examiner

*Primary Examiner* — Phuong Phu
(74) *Attorney, Agent, or Firm* — Ohlandt, Greeley, Ruggiero and Perle, LLP

(57) ABSTRACT

A wireless station includes at least one oscillator to output a reference signal, and an error calculator to calculate a frequency of the reference signal and calculate a frequency error by subtracting a target frequency of the reference signal from the calculated frequency of the reference signal. The wireless station further includes a modulation data generator to generate modulation data by adding a correction value, varying in negative correlation with the frequency error calculated by the error calculator, to data to be transmitted, and a modulator to conduct frequency modulation on the basis of the modulation data and the reference signal.

14 Claims, 4 Drawing Sheets

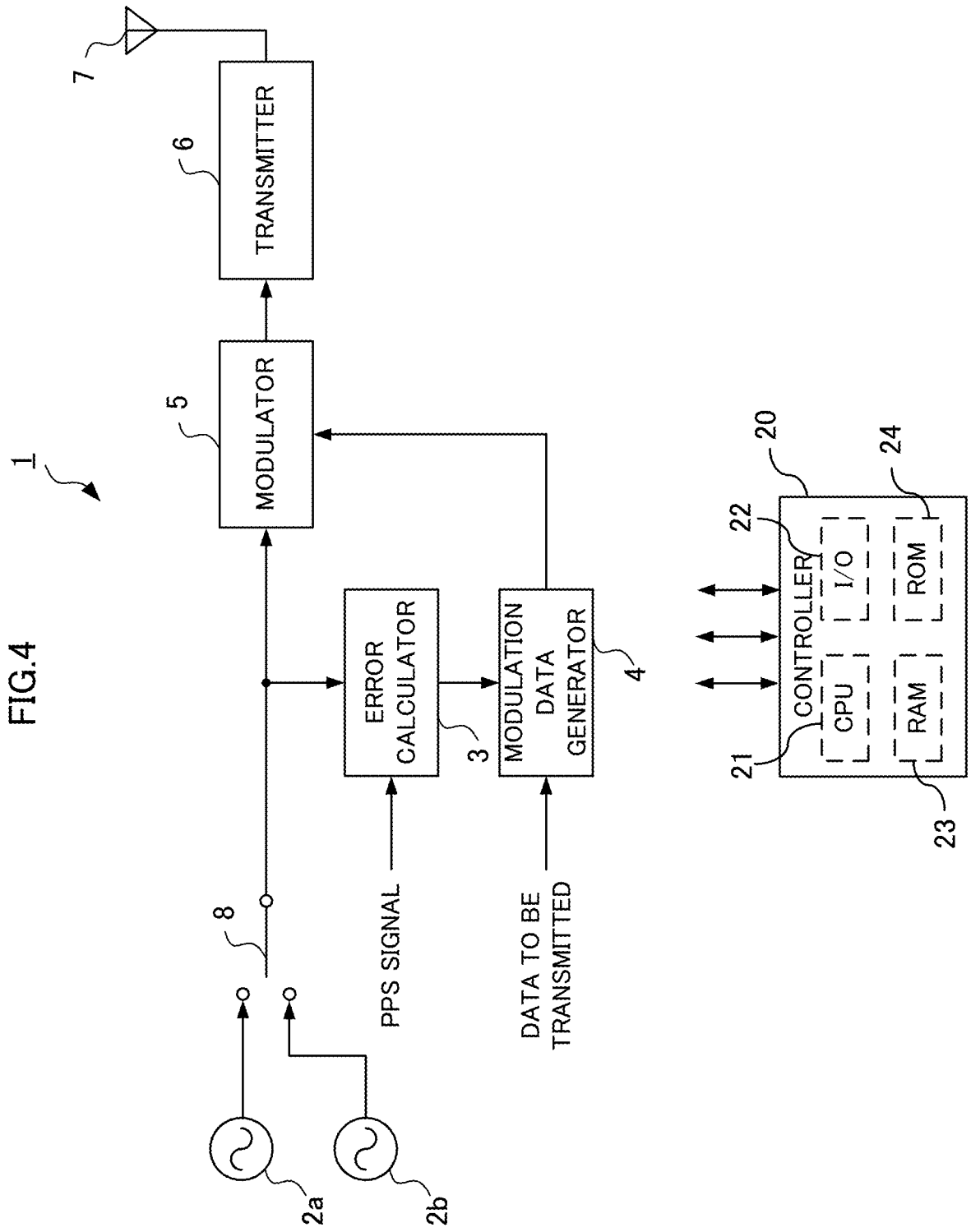

WIRELESS STATION AND METHOD OF CORRECTING FREQUENCY ERROR

CROSS-REFERENCE TO RELATED APPLICATION

This application claims the benefit of Japanese Patent Application No. 2020-056801, filed on Mar. 26, 2020, the entire disclosure of which is incorporated by reference herein.

FIELD

This application relates to a wireless station and a method of correcting a frequency error.

BACKGROUND

In a wireless communication system for simulcast communication, wireless stations at multiple sites transmit data at the same frequency to thereby expand the coverage area. The system therefore requires high frequency accuracy in the radio frequency (RF) range. In order to improve the frequency accuracy, the system may employ a correction apparatus that corrects an error in a clock signal output from an oscillator used in RF modulation. A typical example of this correction apparatus is disclosed in Japanese Patent No. 5783017.

The frequency error correction apparatus disclosed in Japanese Patent No. 5783017 counts the number of clocks of the clock signal, and then calculates a difference of the frequency of the clock signal from a desired oscillation frequency on the basis of time information received via a network and the result of counting. The frequency error correction apparatus then corrects a frequency error in the oscillator on the basis of the calculated frequency difference.

SUMMARY

A wireless station according to a first aspect of the present disclosure includes:
at least one oscillator to output a reference signal;
an error calculator to calculate a frequency of the reference signal, and calculate a frequency error by subtracting a target frequency of the reference signal from the calculated frequency of the reference signal;
a modulation data generator to acquire data to be transmitted, and generate modulation data by adding a correction value to the data to be transmitted, the correction value varying in negative correlation with the frequency error; and
a modulator to conduct frequency modulation on basis of the modulation data and the reference signal.

The modulator preferably includes a voltage controlled oscillator into which the reference signal and the modulation data are input, the voltage controlled oscillator providing an oscillation frequency varying depending on the modulation data.

A median of the modulation data preferably varies in negative correlation with the frequency error.

In a case where the frequency error calculated by the error calculator is a positive value, the modulation data generator preferably generates the modulation data by adding a negative correlation value to the data to be transmitted, and in a case where the frequency error calculated by the error calculator is a negative value, the modulation data generator preferably generates the modulation data by adding a positive correlation value to the data to be transmitted.

Preferably, the at least one oscillator includes a plurality of oscillators, the wireless station further includes a selector to select one of the oscillators, and the error calculator calculates a frequency of a reference signal output from the oscillator selected by the selector, and calculates a frequency error by subtracting a target frequency of the reference signal from the calculated frequency of the reference signal, the reference signal being output from the oscillator selected by the selector.

Preferably, the error calculator counts a number of periods of the reference signal within a constant period of a time signal, and calculates a frequency of the reference signal on basis of the number of periods counted within the constant period, the time signal being generated from a global navigation satellite system (GNSS) signal.

A method of correcting a frequency error according to a second aspect of the present disclosure includes:
calculating a frequency of a reference signal output from at least one oscillator;
calculating a frequency error by subtracting a target frequency of the reference signal from the calculated frequency of the reference signal;
acquiring data to be transmitted;
generating modulation data by adding a correction value to the data to be transmitted, the correction value varying in negative correlation with the frequency error; and
conducting frequency modulation on basis of the modulation data and the reference signal.

According to the disclosure, the error calculator calculates the frequency error in the reference signal output from the at least one oscillator. The modulation data generator generates the modulation data by adding the correction value varying in negative correlation with the frequency error to the data to be transmitted. The modulator then conducts frequency modulation on the basis of the modulation data and the reference signal. This configuration enables the wireless station to correct the frequency error in the reference signal output from the oscillator during operation of the wireless station.

BRIEF DESCRIPTION OF THE DRAWINGS

A more complete understanding of this application can be obtained when the following detailed description is considered in conjunction with the following drawings, in which:

FIG. 4 is a block diagram illustrating a configuration of a wireless station according to Embodiment 2 of the disclosure.

DETAILED DESCRIPTION

The frequency error correction apparatus disclosed in Japanese Patent No. 5783017 includes the oscillator of which the oscillation frequency can be controlled by voltage. The frequency error correction apparatus transmits a control signal based on the calculated frequency difference to the oscillator so as to perform voltage control of the oscillator. A wireless station that switches oscillators to be used requires a plurality of circuits for voltage control of the oscillators. The circuits need to have a large time constant in order to avoid impairment of the carrier-to-noise (C/N) ratio. These conditions inhibit correction of a frequency error in the RF region in the wireless station during operation.

An objective of the disclosure, which has been accomplished in view of the above situations, is to provide a wireless station and a method of correcting a frequency error capable of correcting a frequency error in the reference signal output from the oscillator during operation.

A wireless station and a method of correcting a frequency error according to embodiments of the disclosure are described in detail with reference to the accompanying drawings. In these drawings, the components identical or corresponding to each other are provided with the same reference symbol.

Embodiment 1

Figure 1:
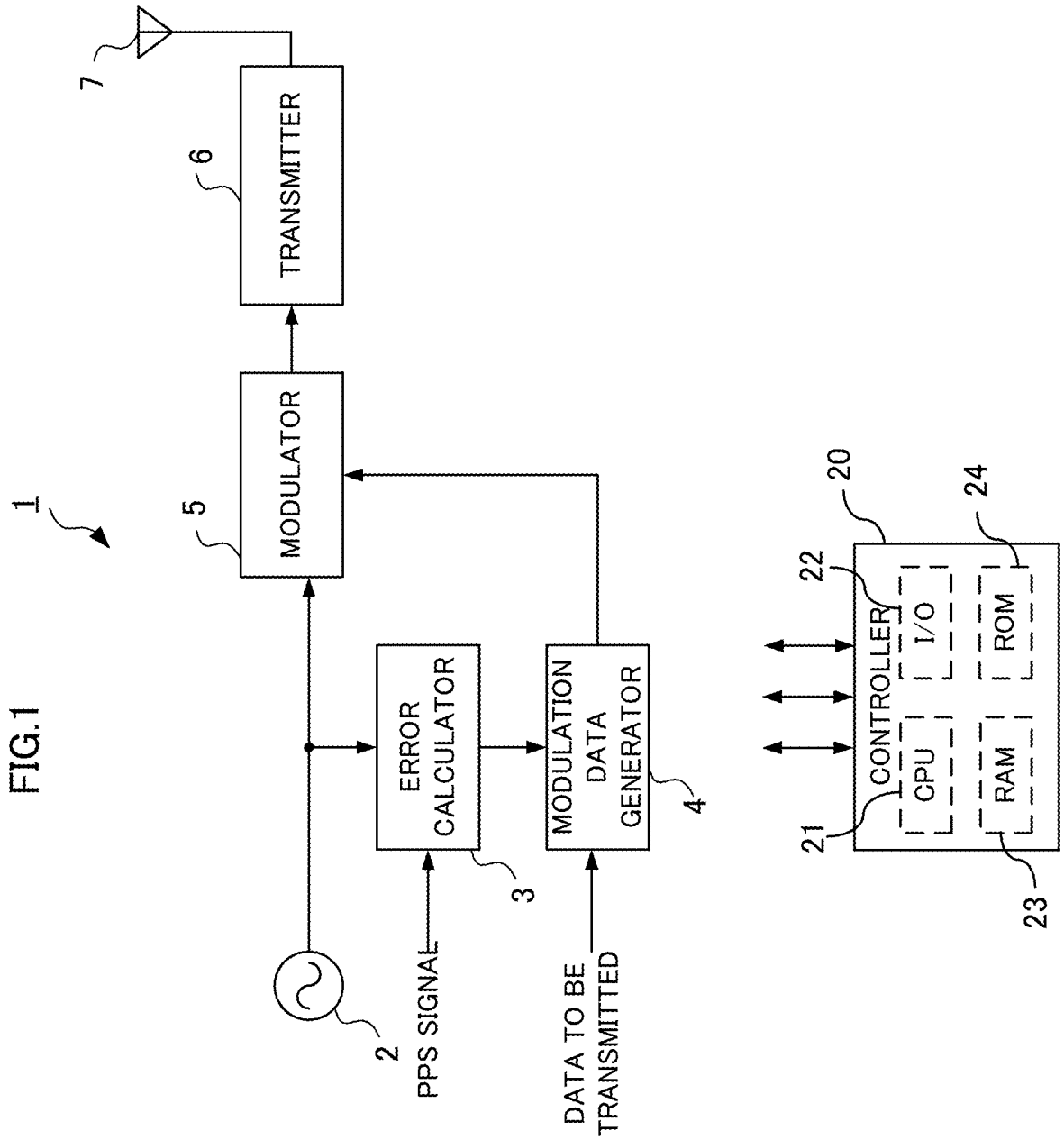
FIG. 1 is a block diagram illustrating a configuration of a wireless station according to Embodiment 1 of the disclosure.

A wireless station 1 according to Embodiment 1 is described with reference to an example of a repeater included in a wireless communication system for simulcast communication. The wireless station 1 illustrated in FIG. 1 includes an oscillator 2 that outputs a reference signal. When the temperature of a quartz resonator included in the oscillator 2 rises during operation of the wireless station 1, the frequency of the reference signal output from the oscillator 2 may be deviated from a target frequency, that is, a frequency error may occur in the reference signal output from the oscillator 2. In order to solve this problem, the wireless station 1 has a function of correcting the frequency error in the reference signal output from the oscillator 2 during operation of the wireless station 1.

The wireless station 1 further includes an error calculator 3 that calculates a frequency error in the reference signal output from the oscillator 2 on the basis of a pulse per second (PPS) signal, and a modulation data generator 4 that generates modulation data by adding a correction value, which is based on the frequency error calculated by the error calculator 3, to data to be transmitted. The PPS signal provides an accurate period and does not vary with temperature or time. The wireless station 1 also includes a modulator 5 that generates a radio frequency (RF) signal by conducting frequency modulation on the basis of the modulation data and the reference signal, and a transmitter 6 that generates a transmission signal from the RF signal generated by the modulator 5 and transmits the generated transmission signal via an antenna 7.

In order to control the above-described components, the wireless station 1 includes a controller 20. The controller 20 includes a central processing unit (CPU) 21, an input/output (I/O) unit 22, a random access memory (RAM) 23, and a read-only memory (ROM) 24. The controller 20 is connected to the individual components of the wireless station 1 via the I/O unit 22, although FIG. 1 does not illustrate signal lines from the controller 20 to the components of the wireless station 1 for the purpose of simplification and facilitation of understanding. The controller 20 controls the initiation and termination of the processes and the details of the processes in the components of the wireless station 1. The CPU 21 executes a control program stored in the ROM 24 and thereby controls the wireless station 1. A command, data, or the like input via the I/O unit 22 is processed and temporarily stored in the RAM 23. The CPU 21 reads the command, data, or the like stored in the RAM 23 as required and thereby controls the wireless station 1.

The individual components of the wireless station 1 are described.

The oscillator 2 includes the quartz resonator and an oscillator circuit. The oscillator 2 outputs a reference signal to the error calculator 3 and the modulator 5. According to Embodiment 1, the reference signal is a sine wave clock signal.

The error calculator 3 acquires a PPS signal from a non-illustrated global navigation satellite system (GNSS) receiver and obtains accurate time information on the basis of the PPS signal. The PPS signal, which is a time signal having a constant period, is generated from a GNSS signal by the GNSS receiver and is output from the GNSS receiver. The error calculator 3 then counts the number of periods of the reference signal within a measurement period. A typical example of the measurement period is the period of the PPS signal. Since the reference signal is a sine wave clock signal as described above, the error calculator 3 counts the number of clocks of the clock signal within the period of the PPS signal. Specifically, the error calculator 3 transforms the clock signal into a rectangular wave, and then counts the number of clocks on the basis of the rectangular wave within the period of the PPS signal.

The error calculator 3 calculates a frequency of the reference signal output from the oscillator 2 on the basis of the counted number of clocks. The error calculator 3 then calculates a frequency error by subtracting a target frequency of the oscillator 2 from the calculated frequency of the reference signal output from the oscillator 2. The error calculator 3 then outputs the calculated frequency error to the modulation data generator 4. Here, the error calculator 3 retains the target frequency of the oscillator 2 in advance.

The modulation data generator 4 acquires data to be transmitted to wireless terminals registered in the wireless station 1, and then generates modulation data by adding a correction value to the data to be transmitted. The data to be transmitted is based on, for example, data acquired from a repeater controller via a non-illustrated communication interface (IF), or data received via a non-illustrated reception antenna from other wireless terminals registered in the wireless station 1.

The correction value, which is added to the data to be transmitted, varies in negative correlation with the frequency error calculated by the error calculator 3. The correction value varies in negative correlation with the frequency error, so that the median of the modulation data varies in negative correlation with the frequency error. The absolute value of the correction value can be obtained by multiplying the frequency error by a factor. This factor is defined depending on the amount of change in the data to be transmitted corresponding to a frequency of 1 Hz.

In the case where the frequency error calculated by the error calculator 3 is a positive value, the modulation data generator 4 generates modulation data by adding a negative correction value to the data to be transmitted. In the case where the frequency error calculated by the error calculator 3 is a negative value, the modulation data generator 4 generates modulation data by adding a positive correction value to the data to be transmitted. The function of the modulation data generator 4 can be achieved by a multiplier and an adder.

The modulator 5 generates an RF signal by conducting frequency modulation on the basis of the modulation data and the reference signal. Specifically, the modulator 5 conducts frequency modulation for causing the frequency of a carrier wave based on the reference signal to vary depending on the modulation data and thereby generates the RF signal. This process can achieve transmission of the data to be transmitted, which is used to generate the modulation data.

A center frequency fc of the RF signal that is a modulated wave is adjusted depending on the frequency error calculated by the error calculator 3 so as to be maintained at the target frequency, as explained in detail later. This process corrects the frequency error in the reference signal, that is, an oscillation frequency error in the oscillator 2.

The transmitter 6 generates a transmission signal on the basis of the RF signal generated by the modulator 5, and then transmits the generated transmission signal via the antenna 7 to, for example, wireless terminals registered in the wireless station 1.

Figure 2:
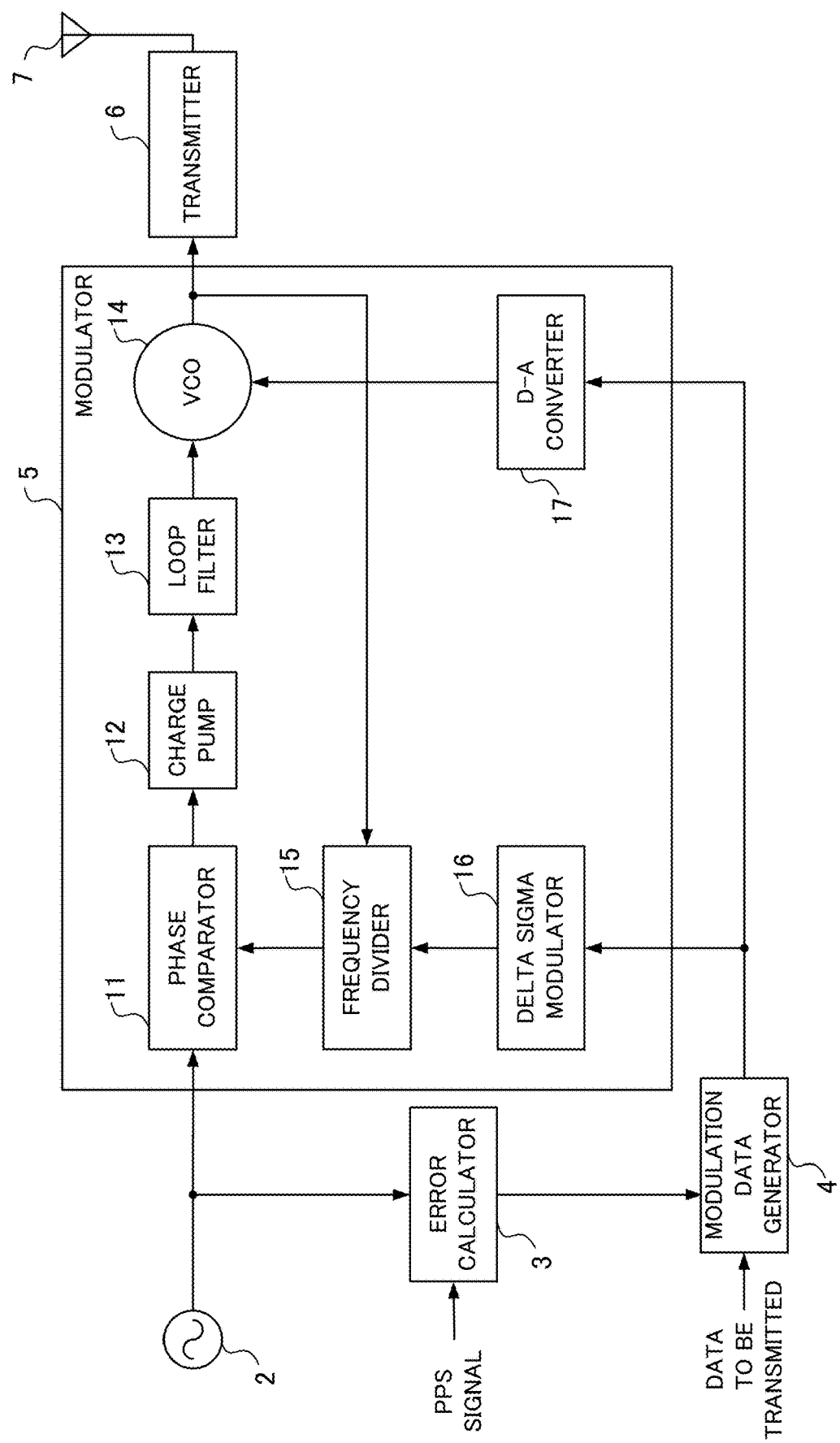
FIG. 2 is a block diagram illustrating a configuration of a modulator according to Embodiment 1.

The above-mentioned configuration of the modulator 5 is described in more detail with reference to FIG. 2. FIG. 2 does not illustrate the controller 20 for the purpose of simplification.

As illustrated in FIG. 2, the modulator 5 includes a phase comparator 11 that outputs a phase difference signal based on both of the reference signal and the RF signal after frequency division in a frequency divider 15, a charge pump 12 that converts the phase difference signal into a current and outputs the current, a loop filter 13 that converts the current from the charge pump 12 into a voltage and outputs the voltage, and a voltage controlled oscillator (VCO) 14 that generates an RF signal by oscillating at an oscillation frequency in accordance with control voltages.

The modulator 5 further includes the frequency divider 15 that conducts frequency division of the RF signal at a division ratio output from a delta sigma modulator 16, the delta sigma modulator 16 that calculates the division ratio on the basis of the modulation data, and a digital-to-analog (D-A) converter 17 that conducts digital-to-analog (D-A) conversion of the modulation data and outputs the converted data.

The following description is directed to the individual components of the modulator 5.

The phase comparator 11 compares the phase of the reference signal and the phase of the RF signal after frequency division in the frequency divider 15, and then outputs a phase difference signal associated with the phase difference between the reference signal and the RF signal after frequency division.

The charge pump 12 converts the phase difference signal into a current by executing a charge pump operation on the basis of the phase difference signal output from the phase comparator 11, and then outputs the current.

The loop filter 13 has characteristics of a low-pass filter (LPF). The loop filter 13 converts the current from the charge pump 12 into a voltage by integration and smoothing, and then outputs the voltage to the VCO 14 in the form of a first control voltage.

The VCO 14 oscillates in accordance with the control voltages and outputs the RF signal. In detail, the oscillation frequency of the VCO 14 varies depending on a second control voltage input from the D-A converter 17.

The frequency divider 15 conducts frequency division of the RF signal output from the VCO 14 at the division ratio output from the delta sigma modulator 16, and then outputs the RF signal after frequency division to the phase comparator 11.

The delta sigma modulator 16 determines a division ratio on the basis of the target value $fc_0$ of the center frequency fc of the RF signal and the modulation data, and then outputs the determined division ratio to the frequency divider 15. The target value $fc_0$ of the center frequency fc of the RF signal indicates the center frequency of the RF signal provided in the case of the frequency of the reference signal output from the oscillator 2 equal to the target frequency.

The D-A converter 17 generates the second control voltage by conducting D-A conversion of the modulation data generated by the modulation data generator 4, and then outputs the second control voltage to the VCO 14.

The median of the second control voltage generated by D-A conversion of the modulation data varies in negative correlation with the frequency error. In detail, in the case where the frequency error is a positive value, that is, in the case where the frequency of the reference signal output from the oscillator 2 is higher than the target frequency, the median of the second control voltage decreases in comparison to the median of the second control voltage in the case of the frequency of the reference signal output from the oscillator 2 equal to the target frequency. Since the median of the second control voltage decreases in the case of the frequency of the reference signal output from the oscillator 2 higher than the target frequency, the center frequency fc of the RF signal is maintained at the target value $fc_0$.

In contrast, in the case where the frequency error is a negative value, that is, in the case where the frequency of the reference signal output from the oscillator 2 is lower than the target frequency, the median of the second control voltage increases in comparison to the median of the second control voltage in the case of the frequency of the reference signal output from the oscillator 2 equal to the target frequency. Since the median of the second control voltage increases in the case of the frequency of the reference signal output from the oscillator 2 lower than the target frequency, the center frequency fc of the RF signal is maintained at the target value $fc_0$. As explained above, since the second control voltage, of which the median varies depending on the frequency error, is input to the VCO 14, the center frequency fc of the RF signal that is a modulated wave can be maintained at the target value $fc_0$. That is, the oscillation frequency error in the oscillator 2 can be corrected.

Figure 3:
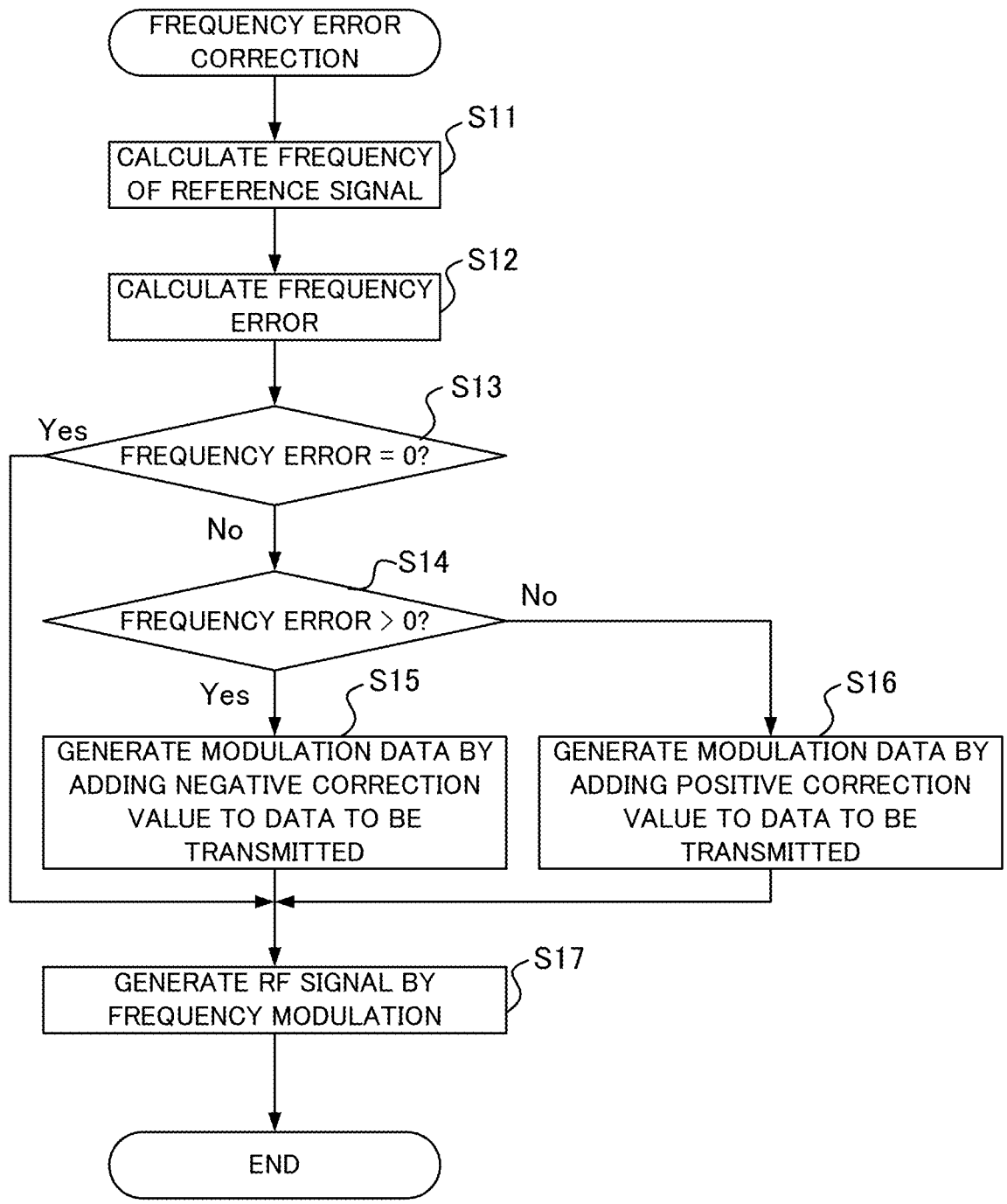
FIG. 3 is a flowchart illustrating exemplary steps of a method of correcting a frequency error executed by the wireless station according to Embodiment 1.

An operation of the wireless station 1 having the above-described configuration is explained with reference to FIG. 3. The error calculator 3 counts the number of clocks of the clock signal (reference signal) within the measurement period, and calculates a frequency of the reference signal output from the oscillator 2 on the basis of the counted number of clocks (Step S11). The error calculator 3 then calculates a frequency error by subtracting the target frequency from the frequency calculated in Step S11 (Step S12).

The modulation data generator 4 determines whether the frequency error calculated in Step S12 is 0 (Step S13). When the frequency error calculated in Step S12 is 0 (Step S13; Yes), Steps S14 to S16 are not executed. The modulation data generator 4 thus outputs data to be transmitted in the form of modulation data. For example, the modulation data generator 4 outputs the modulation data indicating repetition of 10 and −10 on the basis of the data to be transmitted indicating repetition of 10 and −10 in this case.

When the frequency error calculated in Step S12 is not 0 (Step S13; No) and the frequency error is a positive value (Step S14; Yes), the modulation data generator 4 generates modulation data by adding a negative correction value to the data to be transmitted (Step S15). For example, in the case where the frequency error calculated in Step S12 is +1 Hz, the modulation data generator 4 adds a correction value of −1 to the data to be transmitted and thereby generates the modulation data indicating repetition of 9 and −11, and then outputs the generated modulation data, in Step S15.

When the frequency error calculated in Step S12 is not 0 (Step S13; No) and the frequency error is a negative value (Step S14; No), the modulation data generator 4 generates modulation data by adding a positive correction value to the data to be transmitted (Step S16). For example, in the case where the frequency error calculated in Step S12 is −2 Hz, the modulation data generator 4 adds a correction value of 2 to the data to be transmitted and thereby generates the modulation data indicating repetition of 12 and −8, and then outputs the generated modulation data, in Step S16.

After determination that the frequency error calculated in Step S12 is 0 (Step S13; Yes), or after execution of Step S15 or S16, the modulator 5 generates an RF signal by conducting frequency modulation on the basis of the modulation data output from the modulation data generator 4 and the reference signal (Step S17).

In detail, in the case where the modulation data is generated by adding a negative correction value to the data to be transmitted in Step S15, a decrease occurs in the median of the second control voltage input to the VCO 14 included in the modulator 5. This process can maintain the center frequency fc of the RF signal generated in Step S17 at the target value $fc_0$ even when the frequency of the reference signal output from the oscillator 2 is higher than the target frequency. The process can therefore correct the frequency error in the reference signal, that is, the oscillation frequency error in the oscillator 2.

In the case where the modulation data is generated by adding a positive correction value to the data to be transmitted in Step S16, an increase occurs in the median of the second control voltage input to the VCO 14 included in the modulator 5. This process can maintain the center frequency fc of the RF signal generated in Step S17 at the target value $fc_0$ even when the frequency of the reference signal output from the oscillator 2 is lower than the target frequency. The process can therefore correct the frequency error in the reference signal, that is, frequency error in the oscillator 2.

As explained above, the wireless station 1 according to Embodiment 1 generates modulation data by adding a correction value, varying in negative correlation with the frequency error in the reference signal output from the oscillator 2, to the data to be transmitted, and conducts frequency modulation on the basis of the modulation data and the reference signal. This process can maintain the center frequency of the RF signal that is a modulated wave at the target value $fc_0$ and accordingly correct the frequency error in the reference signal output from the oscillator 2 during operation of the wireless station 1. The frequency error in the reference signal output from the oscillator 2 is corrected as a result of frequency modulation, and can therefore be corrected in real time.

Embodiment 2

The wireless station 1 may include a plurality of oscillators. The wireless station 1 that includes oscillators 2a and 2b is described in Embodiment 2. The wireless station 1 illustrated in FIG. 4 includes the oscillators 2a and 2b having different oscillation frequencies. The wireless station 1 is further equipped with a selector 8 that selects one of the oscillators 2a and 2b and transmits a reference signal output from the selected one of the oscillators 2a and 2b to the error calculator 3 and the modulator 5. The following description is directed to the differences from the wireless station 1 according to Embodiment 1.

The selector 8 selects one of the oscillators 2a and 2b under the control of the controller 20. The selector 8 then connects the selected one of the oscillators 2a and 2b to each of the error calculator 3 and the modulator 5.

In the case where the selector 8 selects the oscillator 2a, the oscillator 2a is connected to each of the error calculator 3 and the modulator 5. The reference signal output from the oscillator 2a is thus transmitted to the error calculator 3 and the modulator 5.

In the case where the selector 8 selects the oscillator 2b, the oscillator 2b is connected to each of the error calculator 3 and the modulator 5. The reference signal output from the oscillator 2b is thus transmitted to the error calculator 3 and the modulator 5.

The error calculator 3 retains target frequencies of the respective oscillators 2a and 2b in advance. The error calculator 3 acquires, from the controller 20, information on which one of the oscillators 2a and 2b is selected by the selector 8.

In the case where the selector 8 selects the oscillator 2a, the error calculator 3 counts the number of clocks of the clock signal (reference signal output from the oscillator 2a) within the measurement period, and calculates a frequency of the reference signal output from the oscillator 2a. The error calculator 3 then calculates a frequency error by subtracting the target frequency of the oscillator 2a from the calculated frequency of the reference signal output from the oscillator 2a.

In the case where the selector 8 selects the oscillator 2b, the error calculator 3 counts the number of clocks of the clock signal (reference signal output from the oscillator 2b) within the measurement period, and calculates a frequency of the reference signal output from the oscillator 2b. The error calculator 3 then calculates a frequency error by subtracting the target frequency of the oscillator 2b from the calculated frequency of the reference signal output from the oscillator 2b.

In the case where the selector 8 selects the oscillator 2a, the modulator 5 generates an RF signal by conducting frequency modulation on the basis of the modulation data and the reference signal output from the oscillator 2a.

In the case where the selector 8 selects the oscillator 2b, the modulator 5 generates an RF signal by conducting frequency modulation on the basis of the modulation data and the reference signal output from the oscillator 2b.

As explained above, the wireless station 1 according to Embodiment 2 is equipped with the oscillators 2a and 2b. The wireless station 1 generates modulation data by adding a correction value, varying in negative correlation with the frequency error in the selected one of the oscillators 2a and 2b, to the data to be transmitted, and conducts frequency modulation on the basis of the modulation data and the reference signal output from the selected one of the oscillators 2a and 2b. This process can maintain the center frequency of the RF signal that is a modulated wave at the target value $fc_0$ and accordingly correct the frequency error in the reference signal output from the selected one of the oscillators 2a and 2b during operation of the wireless station 1. The frequency error in the reference signal output from the selected one of the oscillators 2a and 2b is corrected as a result of frequency modulation, and can therefore be corrected in real time.

The above-described examples should not be construed as limiting the embodiments of the disclosure.

A frequency error in the oscillator 2, 2a, or 2b is corrected during data transmission according to the above-described embodiments, but may also be corrected during data reception.

The wireless station 1 may be any wireless station that needs to correct frequency errors during operation, other than the repeater included in the wireless communication system for simulcast communication. The wireless station 1 should not be limited to a repeater and may also be a wireless terminal that conducts communication via a repeater.

The wireless station 1 may be equipped with any number of oscillators. In the wireless station 1 including two or more oscillators 2, the selector 8 selects one of these oscillators 2, as in Embodiment 2.

The error calculator 3 may acquire time information by any means other than the PPS signal. For example, the error calculator 3 may acquire time information from a network time protocol (NTP) server.

The reference signal used in frequency modulation by the modulator 5 is a signal output from the oscillator 2, 2a, or 2b according to the above-described embodiments, but may also be a signal provided by frequency division or multiplication of the clock signal output from the oscillator 2, 2a, or 2b. Also in this case, the frequency of the reference signal can be calculated by counting the number of clocks of the clock signal output from the oscillator 2, 2a, or 2b.

Furthermore, the above-illustrated hardware configurations and flowchart are a mere example and may be modified and corrected in any manner.

The foregoing describes some example embodiments for explanatory purposes. Although the foregoing discussion has presented specific embodiments, persons skilled in the art will recognize that changes may be made in form and detail without departing from the broader spirit and scope of the invention. Accordingly, the specification and drawings are to be regarded in an illustrative rather than a restrictive sense. This detailed description, therefore, is not to be taken in a limiting sense, and the scope of the invention is defined only by the included claims, along with the full range of equivalents to which such claims are entitled.

What is claimed is:

1. A wireless station comprising:
   at least one oscillator to output a reference signal;
   an error calculator to calculate a frequency of the reference signal, and calculate a frequency error by subtracting a target frequency of the reference signal from the calculated frequency of the reference signal;
   a modulation data generator to acquire data to be transmitted, and generate modulation data by adding a correction value to the data to be transmitted, the correction value varying in negative correlation with the frequency error; and
   a modulator to conduct frequency modulation on a basis of the modulation data and the reference signal, wherein
   in a case where the frequency error calculated by the error calculator is a positive value, the modulation data generator generates the modulation data by adding a negative correlation value to the data to be transmitted, and
   in a case where the frequency error calculated by the error calculator is a negative value, the modulation data generator generates the modulation data by adding a positive correlation value to the data to be transmitted.

2. The wireless station according to claim 1, wherein the modulator comprises a voltage controlled oscillator into which the reference signal and the modulation data are input, the voltage controlled oscillator providing an oscillation frequency varying depending on the modulation data.

3. The wireless station according to claim 1, wherein a median of the modulation data varies in negative correlation with the frequency error.

4. The wireless station according to claim 2, wherein a median of the modulation data varies in negative correlation with the frequency error.

5. The wireless station according to claim 1, wherein
   the at least one oscillator comprises a plurality of oscillators,
   the wireless station further comprises a selector to select one of the oscillators, and
   the error calculator calculates a frequency of a reference signal output from the oscillator selected by the selector, and calculates a frequency error by subtracting a target frequency of the reference signal from the calculated frequency of the reference signal, the reference signal being output from the oscillator selected by the selector.

6. The wireless station according to claim 2, wherein
   the at least one oscillator comprises a plurality of oscillators,
   the wireless station further comprises a selector to select one of the oscillators, and
   the error calculator calculates a frequency of a reference signal output from the oscillator selected by the selector, and calculates a frequency error by subtracting a target frequency of the reference signal from the calculated frequency of the reference signal, the reference signal being output from the oscillator selected by the selector.

7. The wireless station according to claim 3, wherein
   the at least one oscillator comprises a plurality of oscillators,
   the wireless station further comprises a selector to select one of the oscillators, and
   the error calculator calculates a frequency of a reference signal output from the oscillator selected by the selector, and calculates a frequency error by subtracting a target frequency of the reference signal from the calculated frequency of the reference signal, the reference signal being output from the oscillator selected by the selector.

8. The wireless station according to claim 4, wherein
   the at least one oscillator comprises a plurality of oscillators,
   the wireless station further comprises a selector to select one of the oscillators, and
   the error calculator calculates a frequency of a reference signal output from the oscillator selected by the selector, and calculates a frequency error by subtracting a target frequency of the reference signal from the calculated frequency of the reference signal, the reference signal being output from the oscillator selected by the selector.

9. The wireless station according to claim 1, wherein the error calculator counts a number of periods of the reference signal within a constant period of a time signal, and calculates a frequency of the reference signal on basis of the number of periods counted within the constant period, the time signal being generated from a global navigation satellite system (GNSS) signal.

10. The wireless station according to claim 2, wherein the error calculator counts a number of periods of the reference signal within a constant period of a time signal, and calculates a frequency of the reference signal on basis of the number of periods counted within the constant period, the time signal being generated from a GNSS signal.

11. The wireless station according to claim 3, wherein the error calculator counts a number of periods of the reference signal within a constant period of a time signal, and calculates a frequency of the reference signal on basis of the number of periods counted within the constant period, the time signal being generated from a GNSS signal.

12. The wireless station according to claim 4, wherein the error calculator counts a number of periods of the reference signal within a constant period of a time signal, and calculates a frequency of the reference signal on basis of the number of periods counted within the constant period, the time signal being generated from a GNSS signal.

13. A method of correcting a frequency error comprising:

calculating a frequency of a reference signal output from at least one oscillator;

calculating a frequency error by subtracting a target frequency of the reference signal from the calculated frequency of the reference signal;

acquiring data to be transmitted;

generating modulation data by adding a correction value to the data to be transmitted, the correction value varying in negative correlation with the frequency error; and conducting frequency modulation on a basis of the modulation data and the reference signal, wherein in a case where the frequency error calculated is a positive value, generating the modulation data by adding a negative correlation value to the data to be transmitted, and in a case where the frequency error calculated is a negative value, generating the modulation data by adding a positive correlation value to the data to be transmitted.

14. The wireless station according to claim 1, wherein correction of the frequency error in the reference signal output from the oscillator is performed during operation.

* * * * *